(12) United States Patent
Cross et al.

(10) Patent No.: US 6,175,182 B1
(45) Date of Patent: Jan. 16, 2001

(54) PSEUDO-SHEAR MODE ACTUATOR

(75) Inventors: L. Eric Cross, State College, PA (US); Jose Chirvella, Tujunga, CA (US); Qing-Ming Wang, State College, PA (US)

(73) Assignee: Penn State Research Foundation, University Park, PA (US)

( * ) Notice: Under 35 U.S.C. 154(b), the term of this patent shall be extended for 0 days.

(21) Appl. No.: 09/040,562

(22) Filed: Mar. 18, 1998

Related U.S. Application Data
(60) Provisional application No. 60/024,049, filed on Aug. 16, 1996.

(51) Int. Cl.[7] .................................................. H01L 41/08
(52) U.S. Cl. ............................................................ 310/328
(58) Field of Search ........................... 310/328, 330–332, 310/333

(56) References Cited

U.S. PATENT DOCUMENTS

| | | | |
|---|---|---|---|
| 4,978,881 | * | 12/1990 | Wakita et al. ........................ 310/328 |
| 5,175,465 | * | 12/1992 | Um et al. .............................. 310/328 |
| 5,245,734 | * | 9/1993 | Issartel .............................. 310/328 X |
| 5,440,194 | * | 8/1995 | Beurrier ................................ 310/328 |

OTHER PUBLICATIONS

Berlincourt, D. A., "Piezoelectric Properties of Poycrystalline Lead Titante Zirconate Compositions," Proceedings of the IRE, IRE, pp. 220–229, (Feb. 1, 1960).

Clevit Corp., "Piezoelectric Technology Data for Designers, " Clevite Corp. (Ohio), pp. 1–45, (Feb. 1, 1965).

Aokagi, M., "Trial Production of an Ultrasonic Motor Using Longitudinal and Torsional Vibrations of a Rod Vibrator Drive by Piezoelectric Plates Inserted in it Axial Direction, "Japan J. Appl. Phys., pp. 6106–6109, (Sep. 1, 1997).

Bauer, A., "Piezo Actuator Special Design, " Fraunhofer Inst. (Jena, Germany), pp. 128–132, (Feb. 1, 1994).

Glazounov, A.E., "Piezoelectric Actuator Generating Torsional Displacement from Piezoelectric d15 Shear Response,"Applied Physics Letters, American Institute of Physics, vol. 72 (No. 20), pp. 2526–2528, (Feb. 1, 1998).

\* cited by examiner

*Primary Examiner*—Mark O. Budd
(74) *Attorney, Agent, or Firm*—Thomas J. Monahan

(57) ABSTRACT

The present invention is a new type of high-strain, pseudo-shear mode piezoelectric ceramic actuator. The pseudo-shear mode actuator employs a stack of pre-poled rectangular ceramic sheets. The stacked sheets form a composite structure assembled from thin sheet soft PZT or PLZT which is poled in the usual direction normal to the major face of the sheet and driven by electrodes upon the major faces. The sheets are conductivity bonded at alternate ends and driven in such a way that alternate sheets expand and contract along the length dimension. Examples of uses would include actuators for linear and rotary motors; step and repeat (inchworm) type actuators; flow sensing and flow control; valving and pumping systems; active noise and vibration control; and large thin panel loudspeakers.

13 Claims, 6 Drawing Sheets

PSEUDO-SHEAR MODE ACTUATOR

This application claims priority to U.S. Provisional Application Ser. No. 60/024,049 filed Aug. 16, 1996.

BACKGROUND

Shear mode actuators made from ceramic piezoelectric materials such as lead zirconate titanate-based ceramics (PZT) are not widely used in industry or defense applications. This is because there is no simple and effective strain amplifying mechanism associated with these ceramic piezoelectric materials. The shear piezoelectric constant $d_{15}$ is larger than the linear constants $d_{31}$ and $d_{33}$ for materials such as PZT. A high electric (E) field applied to the ceramic piezoelectric material is required for strain generation. The E field for strain generation is on the order of 1 Kilovolt per centimeter for PZT material thickness. It is desirable to decrease the voltage required for the high E field, while increasing the shear angle of the ceramic material used. Currently, increasing length and decreasing thickness for a given volume of PZT material allows for reduction of the required voltage to drive the E field needed for strain generation. It also allows for the generation of a large shear generalized displacement for any given voltage. But, increasing length and decreasing thickness of the PZT actuator produces sizing problems and decreases actuator force otherwise available. These problems are compounded by the shear elastic stiffness $C_{44}$ which controls the blocking force being significantly lower than the linear constant $C_{11}$.

It is an object of the present invention to provide a PZT actuator which generates large shear angles at low applied voltages, maintains a compact size and can be used in both linear and shear mode applications.

SUMMARY OF THE INVENTION

The present invention is pseudo-shear mode actuator and a method of making such an actuator. The actuator is made of at least two layers of ceramic material. The layers having a first end, a second end and a thickness that is less than length or width of the layer. There is a bond which bonds the first ends of the layers together and a spacer between the layers. The spacer runs from the bond to the second ends of the layers. The layers are poled in the same direction. The bond is conductive and one of the ends of the layers is connected to a positive electric current and the other end of the layers is connected to a negative electric current. When there is more than two layers, the bond placement and spacer placement alternate between the first and second ends as layers are added. The bonds which alternatively bond the first ends are connected to a positive electric charge and the bonds which alternatively bond the second ends are connected to a negative electric charge. The bond can be an epoxy bond. The spacer can be a polymer, grease or teflon. The layers are a ceramic piezoelectric material.

DETAILED DESCRIPTION

The present invention provides a new type of high strain pseudo-shear mode piezoelectric ceramic actuator. The pseudo-shear mode actuator employs a stack of pre-poled rectangular ceramic sheets. The stacked sheets form a composite structure assembled from thin sheet soft PZT or PLZT which is poled in the usual direction normal to the major face of the sheet and driven by electrodes upon the major faces. The sheets are conductively bonded at alternate ends and driven in such a way that alternate sheets expand and contract along the length dimension. The resulting stack develops a strong shear about the face perpendicular to the bond direction. Electrical contact is made to the surface electrodes through the conductive epoxy with wires contacting alternate pairs of sheets from each side. By alternating the voltage applied to each sheet in the stack from negative to positive large shear angles can be generated resulting is significant displacements. Shear force magnitudes can be controlled by the length-to-thickness ratio of the sheets and very large shear can be generated for thin sheets. The PZT has excellent frequency response characteristics and the actuator can be frequency tuned by changing the sheet sizes in the stack and/or the manner in which the stack is assembled. Stacking and driving by $d_{31}$ allows highs fields to be realized at low terminal voltages. Advantages for the pseudo-shear mode actuator include the following. The ceramic is driven by an $E_3$ field along the poling direction and actuation occurs through $d_{31}$. High $E_3$ fields can be achieved at low terminal voltages, because the actuator is assembled from thin PZT sheets. The electric stiffness $c_{11}$ controls the blocking force and $c_{11}$ is larger than the true shear constant $c_{44}$. Very large angular deflections can be achieved at modest drive voltages. The actuator is particularly suitable for flextensional amplification to make a thin high force, high displacement air acoustic transducer for large area low frequency applications. The actuator can be assembled from thin sheet PZT that is already electroded and pre-poled. The magnitude of shear can be controlled by the ratio Length (L)/thickness (t) and becomes very large for thin sheets.

Figure 1:
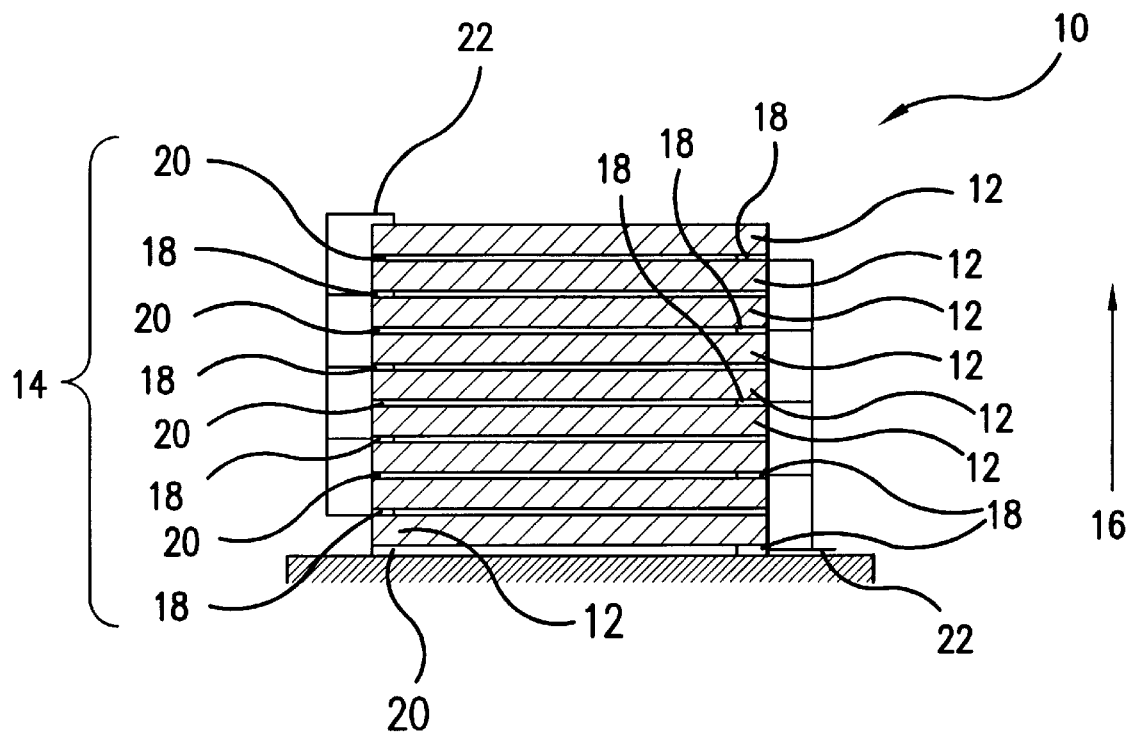
FIG. 1 is a side view of the pseudo-shear mode actuator according to the present invention.

The pseudo-shear mode actuator 10 is assembled from pre-poled PZT ceramic sheets 12 stacked in the manner depicted schematically in FIG. 1. The stack 14 is viewed along the width dimension of the actuator 10. The sheets 12 are rectangular in shape, having typical dimensions in the range of 2.5 cm long×0.5 cm wide×0.05 cm thick. All sheets 12 are poled in the same normal direction 16 as depicted in FIG. 1. The sheets 12 are bonded together by a thin coating of a stiff conducting epoxy 18 at alternate ends of the sheets 12 as shown in FIG. 1. The space between the non-bonded areas of the sheets 12 is filled with spacers 20 of material such as a soft polymer or teflon sheet. Electrical contact is made to the full surface electrodes on the PZT sheets 12 through the conductive epoxy bonds 18, as shown in FIG. 1, whereby wires 22 contact alternate pairs of sheets 12 from each side.

Figure 2:
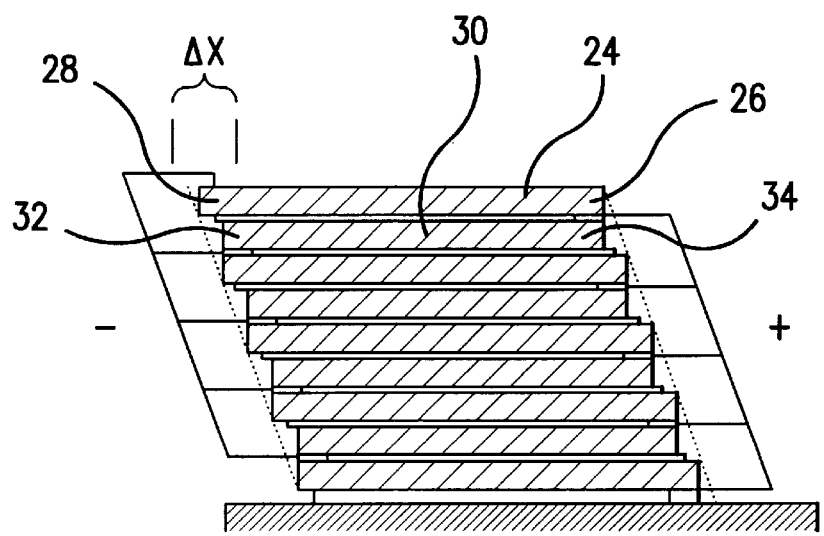
FIG. 2 is a side view of the actuator of FIG. 1 that is activated according to the present invention.
Figure 3:
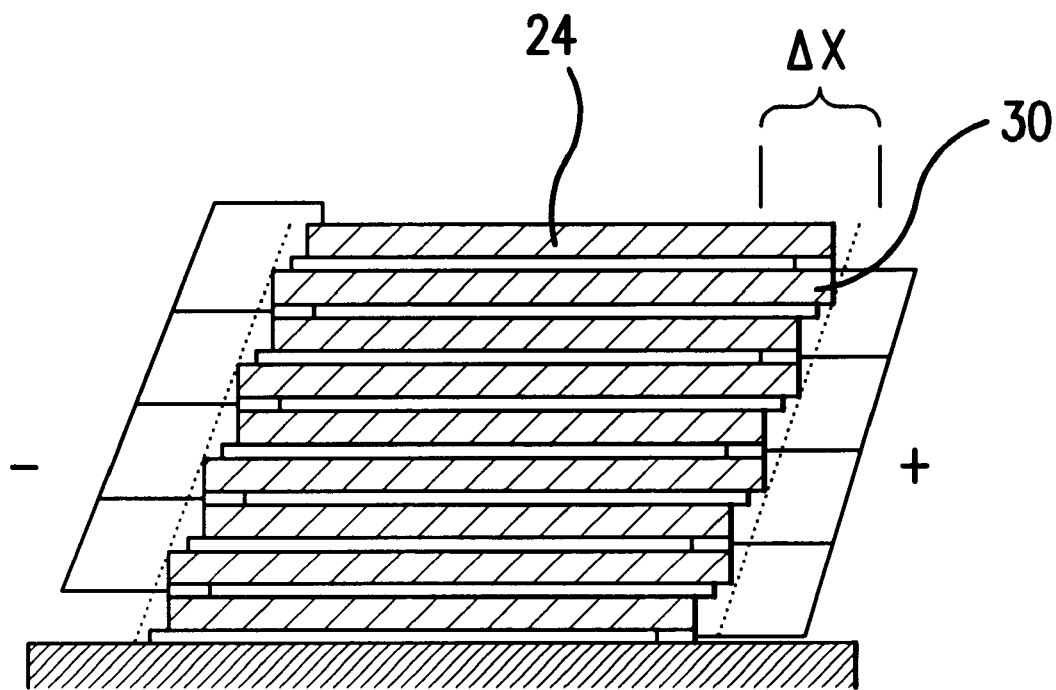
FIG. 3 is a side view of the actuator of FIG. 1 that is activated in the opposite direction to that of FIG. 2 according to the present invention.

For PZTs, the piezoelectric $d_{31}$ constant is negative. The effect of applying a voltage between the two contact wires 22 of FIG. 1 is shown in FIGS. 2 and 3. In FIG. 2, the top or first sheet 24 sees a field against the original poling direction, i.e. a negative field. Thus, because the $d_{31}$ is negative, the resulting linear strain can be defined by the following equation, where L is the length dimension of the stack 14.

$$\Delta x_1 = -d_{31}(-E_3)L = +d_{31}E_3L \qquad (1)$$

When the negative field is applied, the length dimension of the first sheet 24 will increase according to equation (1). Therefore, because the right end 26 of the first sheet 24 is fixed, left end 28 of the first sheet 24 moves to the left by a distance $\Delta x_1$. For the second sheet 30 down in the stack 14 of FIG. 2, there is a positive field applied along the poling direction. The length dimension of the second sheet 30 shrinks according to the following equation.

$$\Delta x_2 = -d_{31}E_3L \qquad (2)$$

Because the left end 32 of the second sheet 30 is fixed, the right end 34 of the second sheet 30 moves a distance $\Delta x_2$ to the left and translates the left end 28 of first sheet 24 a distance $\Delta x_1 + \Delta x_2$ to the left. Therefore, from the equations (1) and (2), a stack 14 of N sheets 12 will move a total distance to the left most element of the first sheet 24 as defined by the following equation for the arrangement shown in FIG. 2.

$$\Delta x_1 + \Delta x_2 \ldots + \Delta x_n = N\, d_{31}E_3L \qquad (3)$$

If the voltage is reversed to the stack 14 shown in FIG. 1, the actuator will shear over with first sheet 24 surface moving to the right instead of the left, as shown in FIG. 3.

Assuming the spacers 20 in the stack 14 are ten percent (10%) of the thickness of the actuator sheets 12, the total stack thickness of the pseudo-shear mode actuator 10 will be 1.1NLt, where t is the thickness of each sheet 12. The shear angle $\delta$ will be defined by the following equation.

$$\delta = N\, d_{31}E_3L/1.1Nt = d_{31}E_3L/1.1t \qquad (4)$$

Because t<<L, the stack 14 can be designed to generate large shear angles. Alternatively, where surface motion is of interest, the stack 14 will generate a displacement $\Delta x_T$ according to the following equation.

$$\Delta x_T = N d_{31}E_3L \qquad (5)$$

Figure 4:
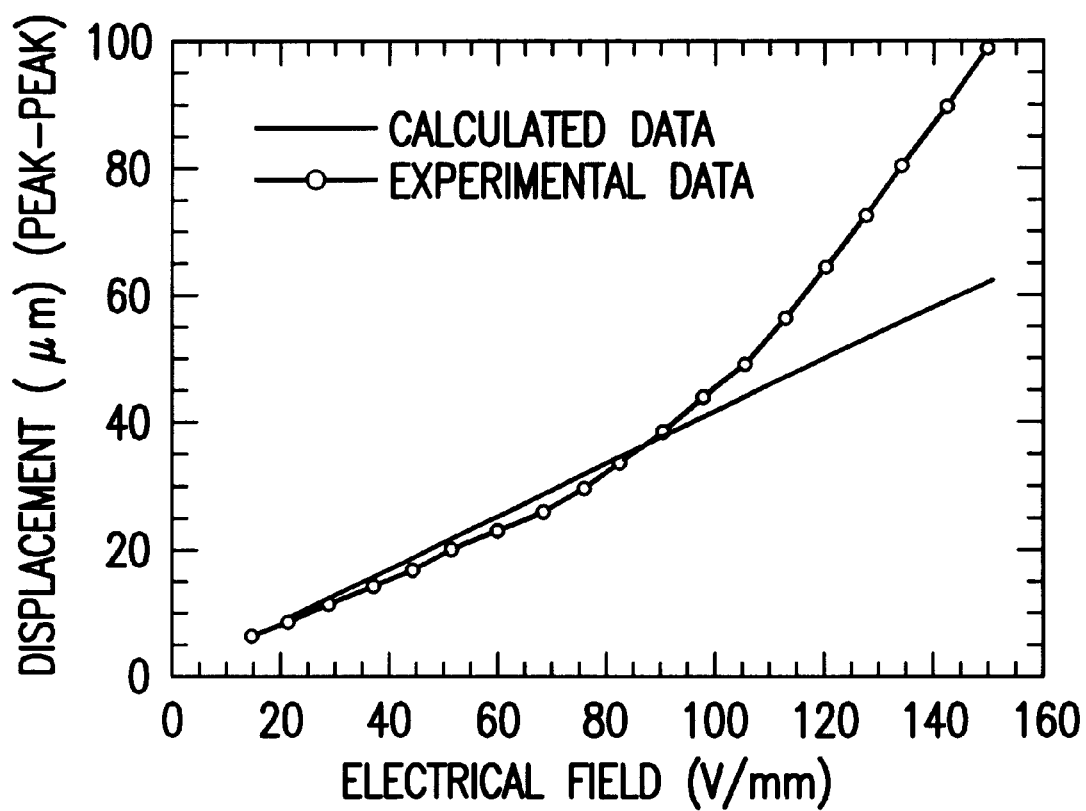
FIG. 4 is a plot of displacement of the actuator as a function of driving field according to the present invention.

A test pseudo-shear mode actuator similar to that depicted in FIG. 1 was constructed from a soft PZT 5H. The dimensions of the sheets were length 25.57 mm, width 4.02 mm and thickness 0.55 mm. A stack comprising 18 poled sheets were assembled using a conductive stiff epoxy bond at alternate ends as depicted in FIG. 1. The displacement of the upper sheet as a function of an applied field is shown in FIG. 4 for a pseudo-shear mode actuator at 1 hz. The solid line of FIG. 4 shows the data points calculated using equation (5). At low E field levels the actual displacements are close to the theory of equation (5) At higher fields, as is well known, the $d_{31}$ of PZT 5H increases significantly with field and therefore there is additional displacement observed. Clearly the surface displacement has been amplified by a factor of more than 18 times in this simple design.

Figure 5:
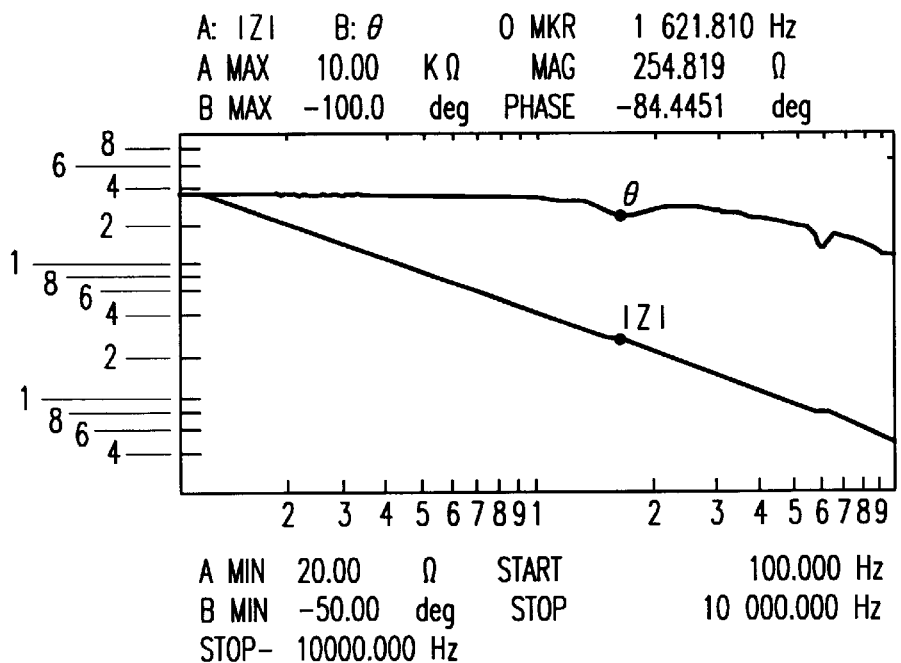
FIG. 5 is a plot of impedance and phase angle as a function of frequency for an actuator of 24 layers according to the present invention.
Figure 6:
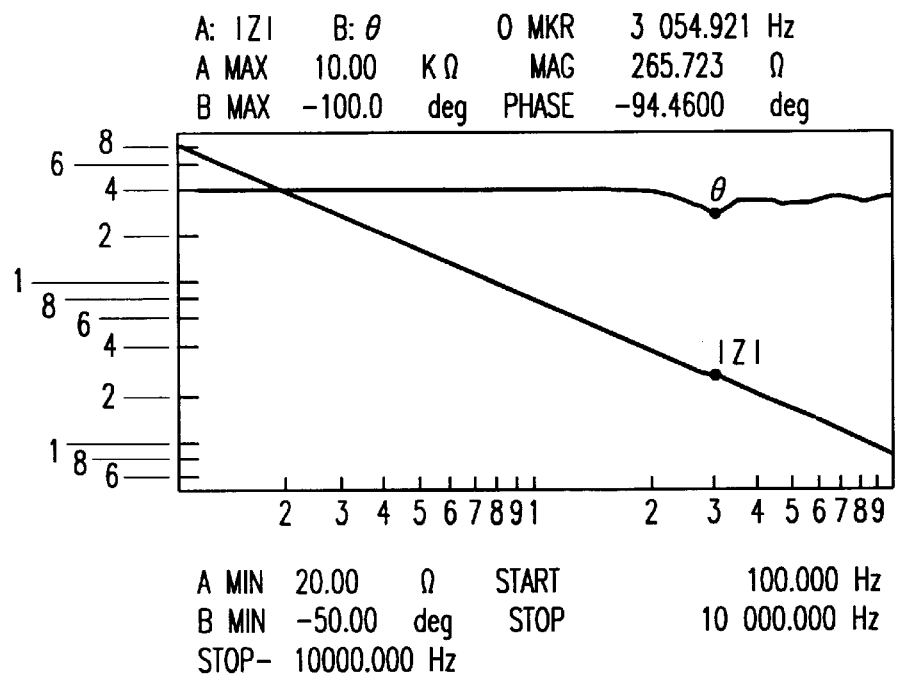
FIG. 6 is a plot of impedance and phase angle as a function of frequency for an actuator of 12 layers according to the present invention.
Figure 7:
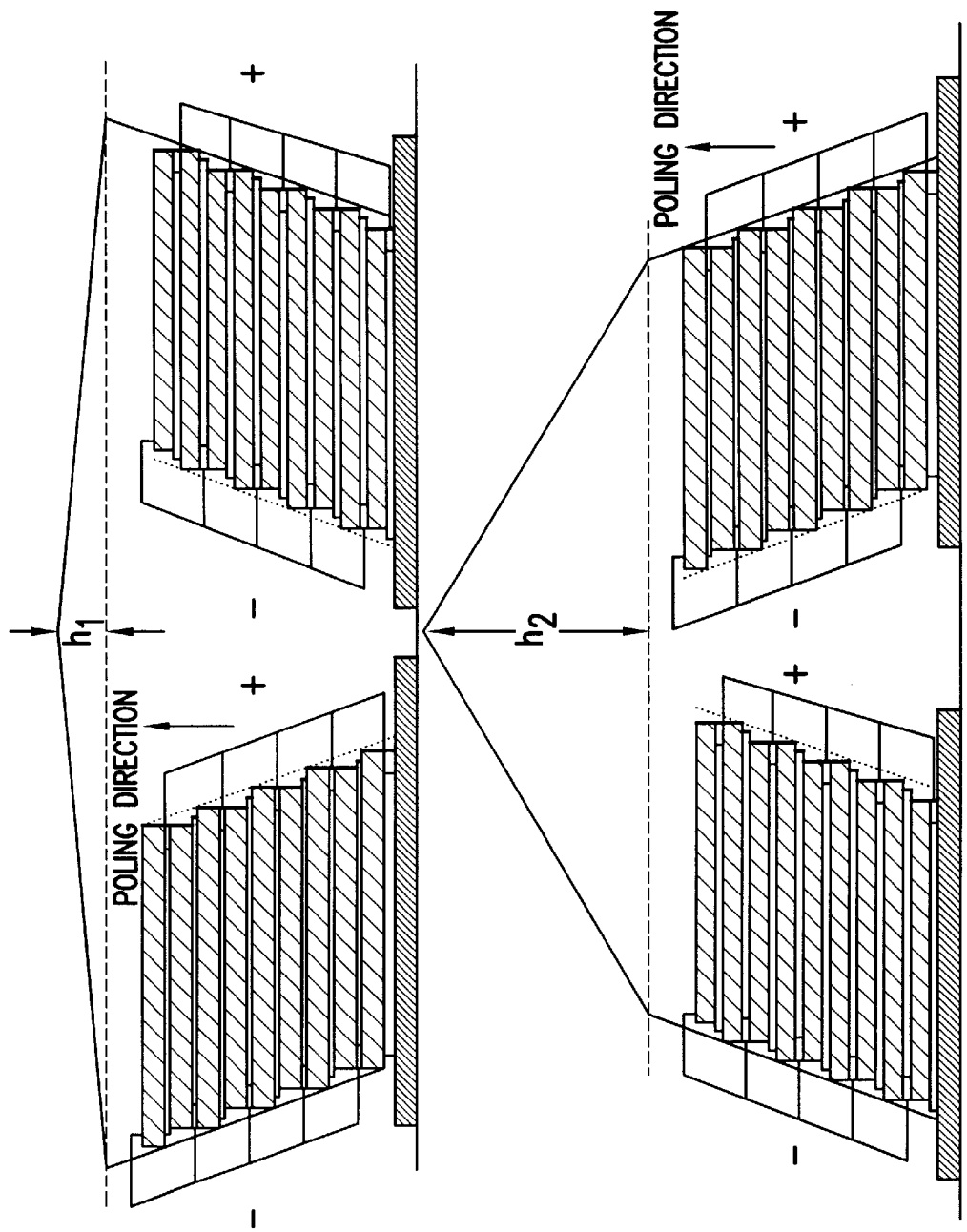
FIG. 7 is a side view of a Flextensional amplifier using two pseudo-shear mode actuators according to the present invention.

In order to explore the frequency characteristics of the pseudo-shear mode actuator, two additional actuator structures were fabricated. The first one had 24 layers of 30×10× 0.5 mm sheets and had an active length of ceramic of 0.624 m. The second one had 12 layers of 30×10×0.5 mm sheets and had an active length of ceramic of 0.312 m. The frequency characteristics may be adduced from the impedance spectra given in FIGS. 5 and 6. The 24 layer structure shows a first longitudinal resonance at 1.6 kHz as evidenced in both impedance and phase angle plots of FIG. 5. For the 12 layer structure, as expected the resonance moves to a little over 3 kHz, as shown in FIG. 6. For the 24 layer structure, the calculated first resonance from the frequency constant of the ceramic should be at 2.3 kHz. It is believed that the reduction in resonant frequency may be associated with the compliance of the epoxy bond, and can be improved by a stiffer bond. Measurements of the blocking force of the 24 layer structure, under a driving field of 1.4 kV/cm yield a value of 6.2 Newton's, which is almost ten times the blocking force of the best equivalent bending mode bimorph or unimorph.

Two other embodiments of the present invention include the use of grease between the sheets and a L-shape joint to bond the sheets together. The grease is a liquid or vacuum grease place between the sheets instead of the polymer or teflon. The grease provides two advantages. The first advantage is protection of the sample electrode from wearing off during the vibration. The second advantage is that transverse lubrication effect and vertical vacuum adhesion effect could strengthen the desired transverse vibration and prevent the undesired bending vibration in the normal direction.

It has been determined that joint bonding of the ceramic sheets plays an important role in performance of the pseudo-shear actuator. Since the epoxy used for bonding the sheets has a lower elastic modulus than the ceramics, the rigidity of the actuator is actually determined by the elastic modulus of the epoxy bond. The epoxy bond undergoes an opposite stress during actuator operation. It is believed that the epoxy bond as shown in FIG. 1 can lead to the following three problems. The first problem is that the opposite stress acting on the epoxy bond will produce typical shear deformations. The second problem is that the epoxy bond forms the uneven contact between neighboring sheets, which makes it difficult to clamp the actuator vertically. Finally, free ends in the of the sheets are the sources for bending vibration at low frequency around 1 kHz. It is believed that the L-shaped bond shown in FIG. will address the above-mentioned problems. An actuator 50 using the L-shape epoxy joint 52 is fabricated as follows. A small rectangular ceramic piece 54 with the same thickness and width as the ceramic sheet 56 is bonded using epoxy 52 to the one side of the lower ceramic sheet 56. Then the next sheet 56 of ceramic material having a spacer 58 between it and the lower ceramic sheet 56 is bonded with epoxy 52 to the small rectangular ceramic piece 54. This procedure is repeated until the desire amount of layers is achieved. As mentioned above, the spacer 58 can be a polymer, teflon or grease.

Figure 8:
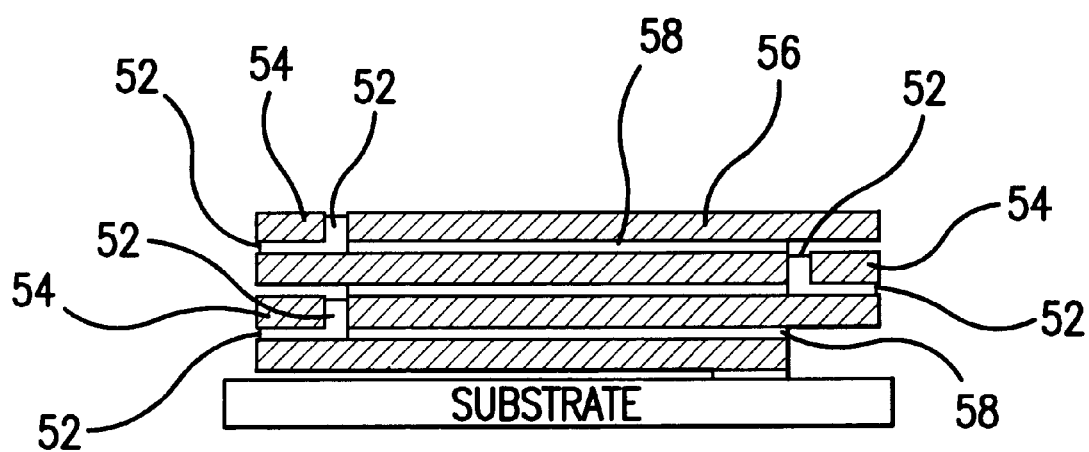
FIG. 8 is a side view of another embodiment of the actuator according to the present invention.

Because of the large shear angles which can be accomplished the pseudo-shear mode actuator, the could replace many conventional actuators. Examples of uses would include actuators for linear and rotary motors; step and repeat (inchworm) type actuators; flow sensing and flow control; valving and pumping systems; active noise and vibration control; and large thin panel loudspeakers. A special application for which the pseudo-shear mode actuator is particularly appropriate is illustrated schematically in FIG. 8. Here the shear has been exaggerated for illustrative purposes. The pent roof structure is a flextensional amplifier which converts the large transverst motion into an amplified vertical motion. If the separation of the drive points is 2 W the amplification factor is approximately defined by the following equation.

$$A = 2W/(h_1 + h_2) \qquad (6)$$

The vertical displacement would then be according to the following equation.

$$\Delta h = 2W(Nd_{31}E_3L)/(h_1 + h_2), \qquad (7)$$

With $2W/(h_1+h_2) \approx 20$ and $N \approx 40$, a field of 10 kV/cm applied to the PZT will drive non resonant surface displacements in the order of 3 mm. The structure of FIG. 8 can be fabricated in a compact fashion in the vertical dimension. Using such a structure, a large area acoustic radiator may be constructed which has the capability of an electromagnetic cone loudspeaker, but much lighter and in the form of a thin panel structure. Such radiators could find wide application in noise control and entertainment systems.

While embodiments of the invention have been described in detail herein, it will be appreciated by those skilled in the art that various modifications and alternatives to the embodiments could be developed in light of the overall teachings of the disclosure. Accordingly, the particular arrangements are illustrative only and are not limiting as to the scope of the invention which is to be given the full breadth of the appended claims and any and all equivalents thereof.

We claim:

1. A pseudo-shear mode actuator comprising:
   at least two rigid layers of ceramic material, said layers having a first end, a second end and a thickness that is less than length or width of the layer;
   a bond which bonds said first ends of said layers together;
   said thickness being thick enough to allow said layers to expand and push against said bond without crumpling; and
   a spacer between said layers running from said bond to said second ends of the layers, said spacer being unsecured to said layers such that said layers can slide and expand along said spacer.

2. The pseudo-shear mode actuator of claim 1, wherein said layers are poled in the same direction.

3. The pseudo-shear mode actuator of claim 1, wherein said bond is conductive and one of said ends of said layers is connected to a positive electric current and the other end of said layers is connected to a negative electric current.

4. The pseudo-shear mode actuator of claim 1, wherein for more than two layers, said bond placement and spacer placement alternate between the first and second ends as layers are added.

5. The pseudo-shear mode actuator of claim 4, wherein said bonds are conductive; wherein bonds which alternatively bond said first ends are connected to a positive electric charge and wherein bonds which alternatively bond said second ends are connected to a negative electric charge.

6. The pseudo-shear mode actuator of claim 1, wherein said bond is an epoxy bond.

7. The pseudo-shear mode actuator of claim 1, wherein said spacer is a polymer.

8. The pseudo-shear mode actuator of claim 1, wherein said spacer is grease.

9. The pseudo-shear mode actuator of claim 1, wherein said spacer is teflon.

10. The pseudo-shear mode actuator of claim 1, wherein said layers are a ceramic piezoelectric material.

11. The pseudo-shear mode actuator of claim 1, wherein said layers are a lead zirconate titanate-based ceramic material.

12. The pseudo-shear mode actuator of claim 1, wherein said bond is an L-shape joint bond having a first leg and a second leg, said first leg connected to one of said layers and said second leg connected to said first end of said other layer.

13. The pseudo-shear mode actuator of claim 12, further including a ceramic piece of the same thickness and width as the layers, said ceramic pieced bonded to both legs of the L-shape joint, said bonding of said ceramic piece to said legs being opposite to where the layers are bonded are bonded to said legs.

* * * * *